(12) United States Patent
Kong et al.

(10) Patent No.: US 11,977,325 B2
(45) Date of Patent: May 7, 2024

(54) PHOTOMASK AND ITS MANUFACTURING METHOD

(71) Applicant: CHANGXIN MEMORY TECHNOLOGIES, INC., Hefei (CN)

(72) Inventors: Zhineng Kong, Hefei (CN); Xiuxuan Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 251 days.

(21) Appl. No.: 17/595,518

(22) PCT Filed: May 2, 2021

(86) PCT No.: PCT/CN2021/091800
§ 371 (c)(1),
(2) Date: Nov. 18, 2021

(87) PCT Pub. No.: WO2021/227910
PCT Pub. Date: Nov. 18, 2021

(65) Prior Publication Data
US 2022/0244633 A1    Aug. 4, 2022

(30) Foreign Application Priority Data
May 15, 2020 (CN) .......................... 202010412215.X

(51) Int. Cl.
*G03F 1/48* (2012.01)
(52) U.S. Cl.
CPC ...................... *G03F 1/48* (2013.01)
(58) Field of Classification Search
CPC ........................................... G03F 1/48
USPC ............................................................. 430/5
See application file for complete search history.

(56) References Cited

U.S. PATENT DOCUMENTS

| 5,089,361 A | 2/1992 | Huang |
| 7,157,190 B2 | 1/2007 | Ramstein |

FOREIGN PATENT DOCUMENTS

| CN | 101046626 A | 10/2007 |
| CN | 201611423 U | 10/2010 |
| CN | 101943855 A | 1/2011 |
| CN | 103955110 A | 7/2014 |
| CN | 105575774 A | 5/2016 |
| JP | H08227141 A | 9/1996 |
| JP | 2019215467 A | 12/2019 |

OTHER PUBLICATIONS

Written Opinion cited in PCT/CN2021/091800, dated Jul. 29, 2021, 7 pages.
International Search Report as cited in PCT Application No. PCT/CN2021/091800 dated Jul. 29, 2021, 5 pages.

*Primary Examiner* — Christopher G Young
(74) *Attorney, Agent, or Firm* — Cooper Legal Group, LLC

(57) ABSTRACT

Some embodiments of the present application provide a photomask and its manufacturing method. The photomask includes: a substrate and a light shielding layer located on the substrate, an opening for exposing a surface of the substrate being formed in the light shielding layer; a barrier layer, the barrier layer covering a side wall of the opening and having its bottom contacted with the substrate.

9 Claims, 4 Drawing Sheets

PHOTOMASK AND ITS MANUFACTURING METHOD

CROSS-REFERENCE TO RELATED APPLICATIONS

This application claims priority to Chinese Patent Application No. 202010412215.X, entitled "PHOTOMASK AND ITS MANUFACTURING METHOD" and filed on May 15, 2020, the entire contents of which are incorporated herein by reference.

TECHNICAL FIELD

The present invention relates to the field of semiconductor, in particular to a photomask and its manufacturing method.

BACKGROUND

A photolithography process is an important step in the semiconductor device manufacturing process, and in this step, a photoresist layer is exposed by using a patterned photomask, and then a same pattern as the photomask is etched on the photoresist layer by developing. The photomask includes a transparent substrate and a light shielding layer located on the substrate, an opening is formed in the light shielding layer, and an orthographic projection of the opening on the photoresist layer is located on a local surface of the photoresist layer.

When the photoresist layer is exposed, one part of light emitted by a light source is blocked by the light shielding layer, and the other part of light passes through the opening and reaches a surface of the photoresist layer, so that a local exposure of the photoresist layer is realized. It should be noted that a quality of the photomask determines a quality of the exposed pattern, such as a number of defects on the photomask, a size variation of the pattern on the photomask, or the like, and the quality of the existing photomask needs to be improved.

SUMMARY

Embodiments of the present application provide a photomask and its manufacturing method, which are beneficial to ensuring that the photomask has good performance in use.

In order to solve the above technical problem, some embodiments of the present application provide a photomask, including: a substrate and a light shielding layer located on the substrate, an opening for exposing a surface of the substrate being formed in the light shielding layer; a barrier layer which covers a side wall of the opening and has its bottom contacted with the substrate.

In addition, the barrier layer covers part of the side wall of the opening.

In addition, a ratio of a height of the barrier layer to a height of the light shielding layer is greater than 0.8.

In addition, a material of the light shielding layer includes any one of chromium, molybdenum, ruthenium, tantalum, platinum, nickel, palladium, silver, tin, indium, and cadmium.

In addition, a material of the barrier layer includes any one of an oxide, a nitride, a carbide, and a silicide.

Further, the barrier layer has a thickness in the range of 5 nm to 10 nm.

In addition, the barrier layer covers the entire side wall of the opening and also covers a top surface of the light shielding layer away from the substrate; an outer surface of the barrier layer is arc-shaped at an intersection of the side wall of the opening and the top surface of the light shielding layer away from the substrate.

Correspondingly, some embodiments of the present application further provide a method for manufacturing a photomask, including: providing a substrate and a light shielding layer located on the substrate; forming an opening in the light shielding layer to expose a surface of the substrate; forming a barrier layer covering the side wall of the opening, the bottom of the barrier layer being in contact with the substrate.

In addition, a material of the light shielding layer includes any one of chromium, molybdenum, ruthenium, tantalum, platinum, nickel, palladium, silver, tin, indium, and cadmium; a material of the barrier layer includes any one of an oxide, a nitride, a carbide and a silicide.

In addition, the barrier layer covers the entire side wall of the opening and also covers a top surface of the light shielding layer away from the substrate; an outer surface of the barrier layer is arc-shaped at an intersection of the side wall of the opening and the top surface of the light shielding layer away from the substrate.

In addition, the light shielding layer is a chromium layer; the barrier layer is a chromium oxide layer.

In addition, an oxidation process is performed on the chromium layer to form a chromium oxide layer; the oxidation process has process parameters of a temperature in the range of 200° C. to 500° C., an oxygen flow in the range of 20 sccm to 50 sccm; or a temperature of 200° C. to 500° C. and a vapor flow in the range of 40 sccm to 100 sccm.

In addition, the forming an opening in the light shielding layer to expose a surface of the substrate includes: forming a photoresist layer on the light shielding layer; exposing and developing the photoresist layer to form a patterned pre-opening, the pre-opening exposing the surface of the light shielding layer; and etching the light shielding layer through the pre-opening to form the opening exposing the surface of the substrate.

In addition, the forming a barrier layer covering the side wall of the opening includes: after the opening is formed, performing an oxidation process on the light shielding layer to form the barrier layer; after the barrier layer is formed, removing the photoresist layer.

Additionally, the oxidation process is performed at a temperature in the range of 60° C. to 80° C.

In addition, the forming a barrier layer covering the side wall of the opening includes: after the opening is formed, removing the photoresist layer; and after removing the photoresist layer, performing a deposition process on the light shielding layer to form a barrier film, and removing the barrier film covering the top surface of the light shielding layer and the bottom of the opening to form the barrier layer.

In the technical solution according to some embodiments of the present application, the side wall of the opening in the light shielding layer is covered with the barrier layer, and the barrier layer can effectively prevent chromium in the light shielding layer from migrating to the side wall of the opening, thereby preventing the chromium from being accumulated on the side wall of the opening, and avoiding an adverse effect of the accumulated chromium on a morphology of the opening, and the ensuring that the opening always has good size uniformity; in addition, the bottom of the barrier layer is in contact with the surface of the substrate, namely the barrier layer covers the corner area between the light shield layer and the substrate, it is beneficial to preventing chromium in the light shield layer from migrating to the surface of the substrate, and avoiding the formation of defects due to migration of chromium to the substrate, thereby avoiding the adverse effect of the defect on exposure and further improving the quality of exposure.

In addition, an outer surface of the barrier layer is arc-shaped at an intersection of the side wall of the opening and the top surface of the light shielding layer away from the substrate, avoiding pointed rectangular bend, which can weaken a diffraction effect of an incident light at the intersection of the side wall of the opening and the top surface of the light shielding layer away from the substrate, improve a three-dimensional effect of photomask, and improve the quality of exposure

BRIEF DESCRIPTION OF DRAWINGS

The exemplary descriptions of one or more embodiments are made by using the corresponding drawings. These exemplary descriptions are not intended to limit the embodiments. The figures of the drawings are not shown to scale unless specifically stated.

DESCRIPTION OF EMBODIMENTS

In order to make the objectives, the technical solutions, and the advantages of the embodiments of the present application more clear, the detailed description of the embodiments of the present application is given below in combination with the accompanying drawings. The ordinary skills in the art can understand that many technical details are provided in the embodiments of the present application so as to make the readers better understand the present application. However, even if these technical details are not provided and based on a variety of variations and modifications of the following embodiments, the technical solutions sought for protection in the present application can also be realized.

Figure 1:
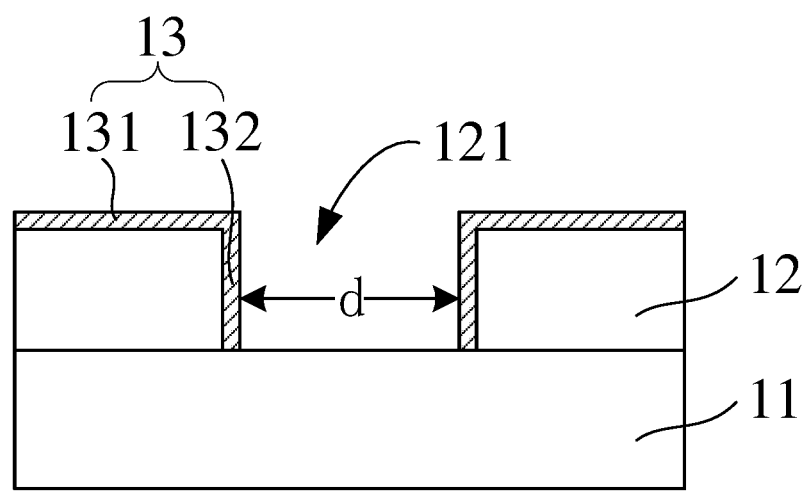
FIG. 1 is a schematic structural diagram of a cross section of a photomask according to an embodiment of the present disclosure.

Referring to FIG. 1, in this embodiment, a photomask includes: a substrate 11 and a light shielding layer 12 on the substrate 11, the light shielding layer 12 having an opening 121 therein to expose a surface of the substrate 11; and a barrier layer 13, the barrier layer 13 covering a side wall of the opening 121, a bottom of the barrier layer 13 being in contact with the substrate 11. The photomask has a critical dimension d, which is a dimension of the opening 121 on the photomask.

The photomask according to the embodiment of the present application will be described in detail below with reference to the accompanying drawings.

The substrate 11 is made of a transparent material, and when a photomask is used for pattern transfer, light passes through the exposed surface of the substrate 11, so that a photoresist on the wafer is exposed, and then developed, thereby implementing the pattern transfer. The material of the substrate 11 includes quartz glass. A wavelength of light commonly used for exposure is 365 nm, 248 nm, 157 nm or 193 nm.

Specifically, the barrier layer 13 includes a first barrier layer 131 covering the entire side wall of the opening 121, and the bottom of the first barrier layer 131 is in contact with the surface of the substrate 11. Thus, when the material of the light shielding layer 12 is chromium, the first barrier layer 131 prevents the chromium in the light shielding layer 12 from migrating to the side wall of the opening 121 and the surface of the substrate 11, so as to ensure that the opening 121 always has good dimensional uniformity and that the defect due to the chromium migration will not occur at the bottom of the opening 121, and further ensure the quality of exposure of the photomask.

The light shielding layer is made of any one of chromium, molybdenum, ruthenium, tantalum, platinum, nickel, palladium, silver, tin, indium and cadmium; the material of the barrier layer includes any one of an oxide, a nitride, a carbide and a silicide.

In this embodiment, the barrier layer has a thickness in the range 5 nm to 10 nm, for example 7 nm, 8 nm, 9 nm. An example taken in this embodiment is the material of the barrier layer 23 being chromium oxide and silicon carbide with large differences in physical properties and atomic distances, so as to obtain a width of the barrier layer 23 required for preventing chromium in the light shielding layer 12 from migrating to the side wall of the opening 121 under different material conditions, and further obtain a width range of the barrier layer 23. The barrier layer 23 within this width range not only has a good barrier effect, but also reduces an influence on the size of the photomask.

In this embodiment, the barrier layer 13 further includes a second barrier layer 132 covering the top surface of the light shielding layer 12, and the material of the second barrier layer 132 may be the same as that of the first barrier layer 131. Specifically, for example, when the material of the light shielding layer 12 is chromium, the arrangement of the second barrier layer 132 can prevent chromium in the light shielding layer 12 from migrating to the top surface of the light shielding layer 12 and avoid damages to a surface smoothness of the light shielding layer 12, so as to prevent diffuse reflection due to the chromium impurity from affecting the exposure effect, which is beneficial to improving the quality of exposure.

Figure 2:
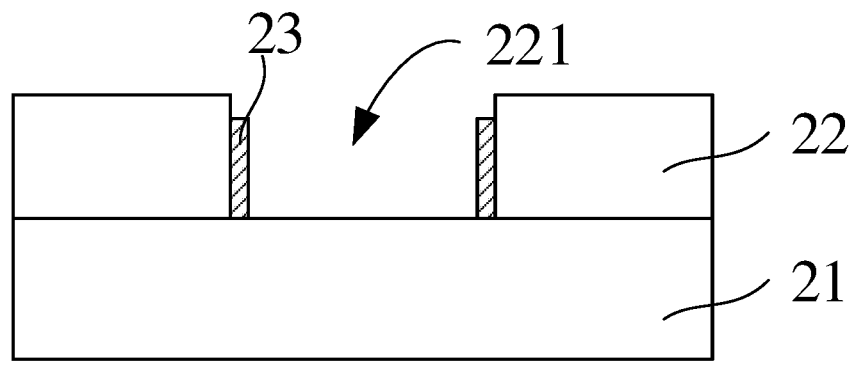
FIG. 2 is a schematic structural diagram of a cross section of a photomask according to another embodiment of the present disclosure.

In one embodiment, referring to FIG. 2, part of the side wall of the opening 221 is covered with the barrier layer 23.

It should be noted that, when part of the side wall of the opening 221 is covered with the barrier layer 23, in a direction perpendicular to the surface of the substrate 21, a ratio of a height of the barrier layer 23 to a height of the light shielding layer 22 shall be greater than 0.8.

In some embodiments, for example, when the light shielding layer 22 is made of chromium, chromium impurities may be accumulated on the side wall of the uncovered light shielding layer 22 due to migration of chromium, which leads to the fact that the more the side wall of the light shielding layer 22 is exposed, the greater an amount of chromium impurities accumulated. Therefore, when the barrier layer 23 only covers part of the side wall of the light shielding layer 22, a ratio of a height of the barrier layer 23 to a height of the light shielding layer 22 shall be greater than 0.8, so that a great amount of chromium impurities can be prevented from being accumulated on the side wall of the opening 221, thereby avoiding the influence of the great amount of accumulated chromium impurities on a topography of the opening 221, which is beneficial to ensuring that the photomask has better critical dimension uniformity and ensuring the quality of exposure.

Figure 3:
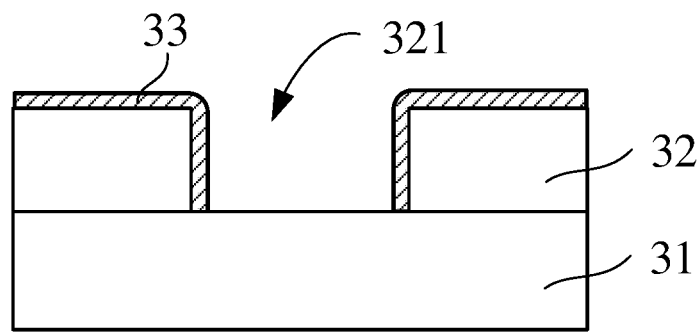
FIG. 3 is a schematic structural diagram of a cross section of a photomask according to yet another embodiment of the present disclosure.

In one embodiment, as shown in FIG. 3, the barrier layer 33 covers the entire side wall of the opening 321, and also covers the top surface of the light shielding layer 32 away from the substrate 31; the outer surface of the barrier layer 33 is arc-shaped at an intersection of the side wall of the opening 321 and the top surface of the light shielding layer 32 away from the substrate 31, avoiding pointed rectangular bend, which can weaken a diffraction effect of an incident light at the intersection of the side wall of the opening 321 and the top surface of the light shielding layer 32 away from the substrate 31, improve a three-dimensional effect of photomask, and improve the quality of exposure.

Correspondingly, the embodiment of the present application further provides a method for manufacturing a photomask, which can be used for forming the above photomask.

FIGS. 4 to 7 are schematic structural diagrams of cross sections corresponding to individual steps of a method for manufacturing a photomask according to an embodiment of the present disclosure.

Figure 4:
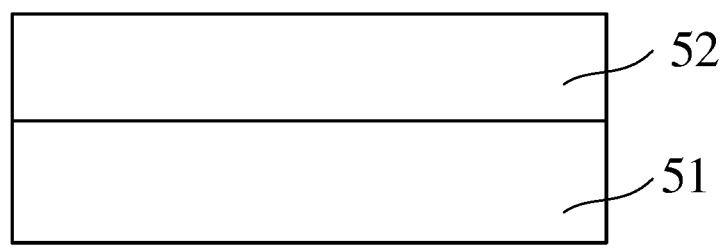
FIGS. 4 to 7 are schematic structural diagrams of cross sections corresponding to individual steps of a method for manufacturing a photomask according to an embodiment of the present disclosure.

Referring to FIG. 4, a substrate 51 and a light shielding layer 52 on the substrate 51 are provided.

In some embodiments, substrate 51 is made of a transparent material, such as glass. The material of the light shielding layer 52 includes any one of chromium, molybdenum, ruthenium, tantalum, platinum, nickel, palladium, silver, tin, indium, and cadmium.

An opening exposing the surface of the substrate 51 is formed in the light shielding layer 52, specifically including the following steps.

Figure 5:
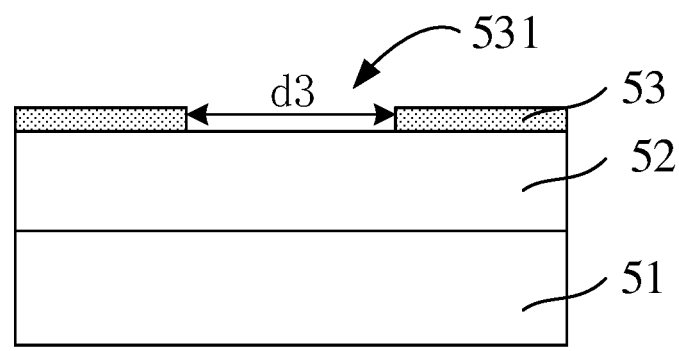

Referring to FIG. 5, a photoresist layer 53 is formed on a surface of the light shielding layer 52 away from the substrate 51, the photoresist layer 53 is exposed and developed to form a patterned pre-opening 531, and the pre-opening 531 exposes the surface of the light shielding layer 52.

In this embodiment, the material of the barrier layer to be formed later includes any one of an oxide, a nitride, a carbide, and silicide. In some embodiments, when the barrier layer is made of a non-light-transmitting material, a width d3 of the pre-opening 531 in a direction parallel with the surface of the substrate 51 is equal to a sum of the critical dimension d of the photomask to be reserved subsequently and twice the width of the barrier layer; the barrier layer is made of a transparent material, such as silicon oxide and the like, the width of the pre-opening in the direction parallel with the surface of the substrate is equal to the critical dimension d of the photomask, and the transparent material is adopted as the material of the barrier layer, which enables a deposition process to be directly performed to form the barrier layer, dispensing with an additional etching process, favorably further shortening the process cycle of the photomask; in addition, the transparent material will not obstruct light, so that the quality of exposure of the photomask would not be influenced.

Figure 6:
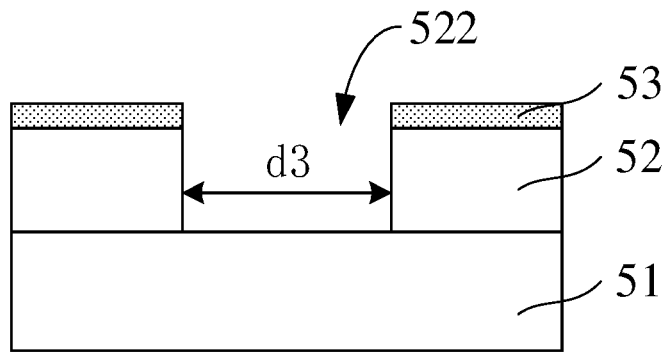

Referring to FIG. 6, the light shielding layer 52 (refer to FIG. 5) is etched through the pre-opening 531 (refer to FIG. 5) to form an opening 522 exposing the surface of the substrate 51.

Figure 7:
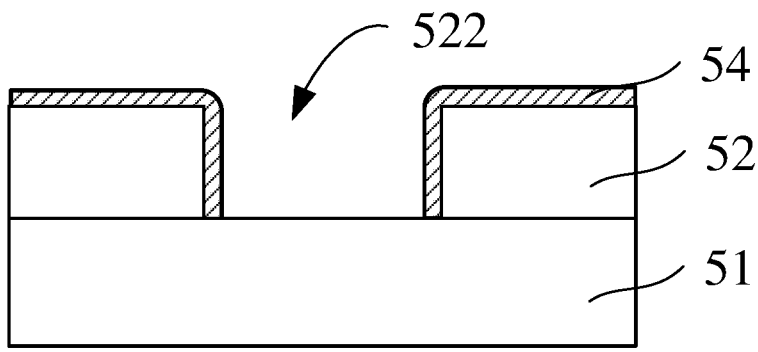

Referring to FIG. 7, after formation of the opening 522, the photoresist layer 53 (refer to FIG. 6) is removed and after removal of photoresist layer 53, the barrier layer 54 is formed, covering the side wall of opening 522, and the bottom of the barrier layer 54 is in contact with the surface of substrate 51.

In this embodiment, the barrier layer 54 covers the entire side wall of the opening 522 and also covers the top surface of the light shielding layer 52 away from the substrate 51; an outer surface of the barrier layer 54 is arc-shaped at an intersection of the side wall of the opening 522 and the top surface of the light shielding layer 52 away from the substrate 51, thus avoiding pointed rectangular bend, which can weaken a diffraction effect of an incident light at the intersection of the side wall of the opening 522 and the top surface of the light shielding layer 52 away from the substrate 51, improve a three-dimensional effect of photomask, and improve the quality of exposure.

The light shielding layer 52 is a chromium layer, the barrier layer 54 is a chromium oxide layer, and the chromium oxide layer can be formed by performing an oxidation process on the chromium layer. In some embodiments, the width and compactness of the barrier layer 54 covering the side wall of the light shield layer 52 in the direction parallel with the surface of the substrate 51 is related to the parameters of the oxidation process.

Preferably, the oxidation process has process parameters of a temperature in the range of 200° C. to 500° C., an oxygen flow in the range of 20 sccm to 50 sccm; or a temperature of 200° C. to 500° C. and a vapor flow in the range of 40 sccm to 100 sccm. The barrier layer 54 formed by the parameters of the oxidation process has the characteristics of short process time and high compactness (namely, thin width) of the formed barrier layer 54, and an overall structure size of the photomask can be reduced while a blocking effect of the barrier layer 54 is ensured.

In the embodiment, a thermal oxidation process is performed by using gas, so that the chromium oxide has an arc-shaped outer surface at an intersection of the side wall of the opening 522 and the top surface of the light shielding layer 52, which facilitates improvements of the three-dimensional effect of photomask, and quality of exposure; moreover, the chromium oxide is also formed on the top surface of the light shielding layer 52, so that chromium can be prevented from migrating to the top surface of the light shielding layer 52 and damaging a surface smoothness of the light shielding layer 52, thereby avoiding the influence of diffuse reflection caused by the existence of chromium impurities on the exposure effect, and further improving the quality of exposure. In addition, the barrier layer 54 is formed by an oxidation process selectively on the surface of the light shielding layer 52, which avoids the influence on a light transmitting region, pollution to the surface of the substrate 51 due to the formation process of the barrier layer 54, damages to the surface of the substrate 51 during cleaning pollution, and also adverse influences of surface pollution and surface damage on exposure, thus guaranteeing the quality of exposure.

Figure 8:
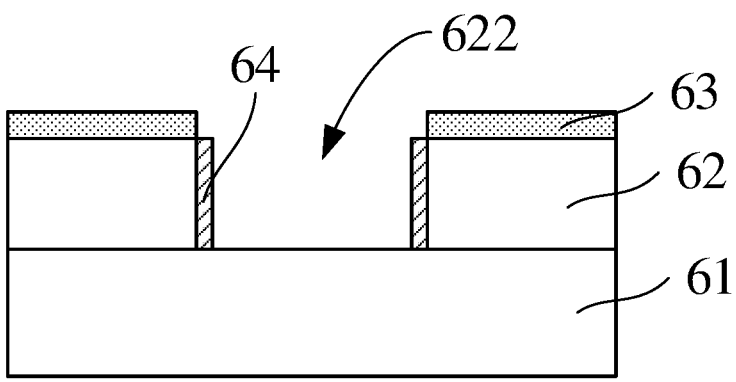
FIG. 8 is a schematic structural diagram of a cross section corresponding to a step of a method for manufacturing a photomask according to another embodiment of the present disclosure.

Another embodiment of the present application further provides a method for manufacturing a photomask, which is different from the previous embodiment in that in the present embodiment, an oxidation process is performed before the photoresist layer is removed. Detailed descriptions will be made below with reference to FIG. 8 which is a schematic structural diagram of a cross section corresponding to a step of a method for manufacturing a photomask according to another embodiment of the present disclosure. The same or corresponding manufacturing steps as or to those in the previous method embodiment may refer to corresponding descriptions in the previous method embodiment, which are not described in detail below.

In this embodiment, the oxidation process is performed to form the barrier layer 64 covering the side wall of the opening 622 of the light shielding layer 62 before the photoresist layer 63 is removed; the photoresist layer 63 is removed after the barrier layer 64 is formed.

In this embodiment, the oxidation process has the process parameter of a temperature in the range of 60° C. to 80° C., at which, the barrier layer is formed using the oxidation process. Compared to the previous embodiment, the parameter of the oxidation process in the present embodiment has a lower oxidation temperature. Preferably, the oxidation process can be carried out in a vapor environment to increase an oxidation rate.

Since an area of a region where the barrier layer 64 is required to be formed is relatively small in the embodiment, the barrier layer 64 with a high compactness can be formed only under a lower oxygen concentration without changing the oxidation temperature, and the oxidation temperature is actually reduced in the embodiment, which thus avoiding cineration of the photoresist caused by a high-temperature oxygen environment under the condition that the compactness of the barrier layer 64 is guaranteed, thereby further preventing the surface of the substrate 61 from being polluted, and guaranteeing the quality of exposure of the photomask.

In this embodiment, the formation region of the barrier layer 64 is defined by using the existing photoresist layer 63, with no need to form a definition layer separately, which is beneficial to shortening a manufacturing cycle of the photomask; in addition, the photoresist cineration is avoided by reducing the oxidation temperature, which is beneficial to avoiding the pollution of the substrate 61 and ensuring the quality of exposure of the photomask.

Figure 9:
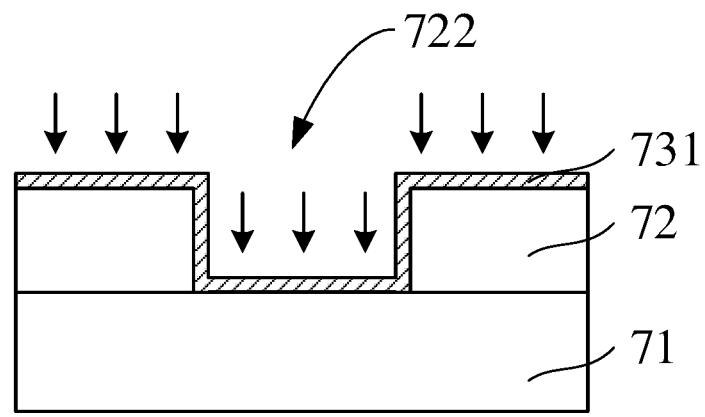
FIG. 9 is a schematic structural diagram of a cross section corresponding to a step of a method for manufacturing a photomask according to yet another embodiment of the present disclosure.

Yet another embodiment of the present application further provides a method for manufacturing a photomask, which is different from the previous embodiment in that in this embodiment, the deposition process is performed after the photoresist layer is removed to form a barrier film. FIG. 9 is a schematic structural diagram of a cross section corresponding to a step of a method for manufacturing a photomask according to yet another embodiment of the present disclosure. The same or corresponding manufacturing steps as or to those in the previous method embodiment may refer to corresponding descriptions in the previous method embodiment, which are not described in detail below.

In this embodiment, after the photoresist layer is removed, the deposition process is performed to form a barrier film 731, the barrier film 731 covers the top surface of the light shielding layer 72 and the side wall and the bottom of the opening 722; after the barrier film 731 is formed, a maskless dry etching process is performed to remove the barrier film 731 covering the top surface of the light shielding layer 72 and the bottom of the opening 722, so as to form the barrier layer.

In this embodiment, a hardness of the material of the substrate 71 is greater than that of the material of the barrier film 731, which is beneficial to preventing the surface of the substrate 71 from being damaged when the barrier film 731 at the bottom of the opening 722 is etched away, thereby guaranteeing the quality of exposure of the photomask.

In this embodiment, the barrier film 731 is formed by the deposition process and etched to form the barrier layer, with no need to wait for the heating and cooling time required for the oxidation process, which contributes to shortening the manufacturing cycle of the photomask.

Figure 10:
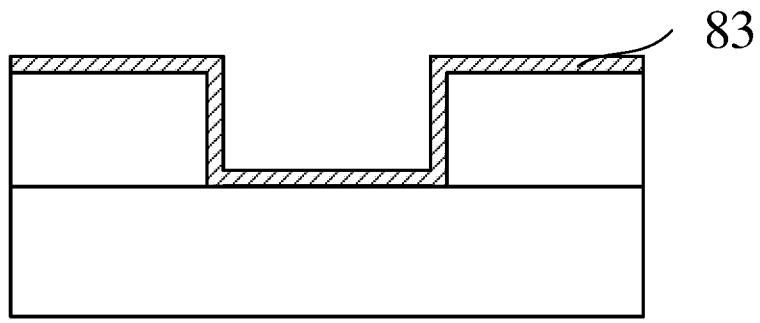
FIG. 10 is a schematic structural diagram of a cross section corresponding to a step of a method for manufacturing a photomask according to still another embodiment of the present disclosure.

Still another embodiment of the present application further provides a method for manufacturing a photomask, which is different from the previous embodiment in that in this embodiment, the barrier layer is made of the transparent material. Detailed description will be made below with reference to FIG. 10 which is a schematic structural diagram of a cross section corresponding to a step of a method for manufacturing a photomask according to still another embodiment of the present disclosure. The same or corresponding manufacturing steps as or to those in the previous method embodiment may refer to corresponding descriptions in the previous method embodiment, which are not described in detail below.

In the present embodiment, the barrier layer 83 is made of the transparent material, for example, silicon oxide or polyimide; the barrier layer 83 may be formed directly by the deposition process, and further, may be formed using an atomic layer deposition process, thus contributing to obtaining the barrier layer 83 with a higher compactness.

In this embodiment, the barrier layer 83 is made of a transparent material, and the deposition process is directly performed to form the barrier layer 83, with no need to perform an additional etching process, which further shortens the process cycle of the photomask. In addition, the transparent material will not obstruct light, so the quality of exposure of the photomask plate would not be influenced.

The ordinary skills in the art can understand that the implementations described above are particular embodiments for implementing the present application. In practical uses, various changes in forms and details may be made to the implementations without departing from the spirit and scope of the present application. Any skills in the art may make their own changes and modifications without departing from the spirit and scope of the present application. Therefore, the protection scope of the present application shall be subject to the protection scope of the claims.

What is claimed is:

1. A photomask, comprising:
a substrate and a light shielding layer located on the substrate, an opening for exposing a surface of the substrate being formed in the light shielding layer; and
a barrier layer which covers an entire side wall of the opening and also covers a top surface of the light shielding layer away from the substrate, wherein a bottom of the barrier layer contacts the substrate, an outer surface of the barrier layer is arc-shaped at an intersection of the side wall of the opening and the top surface of the light shielding layer away from the substrate, the light shielding layer is a chromium layer, the barrier layer is a chromium oxide layer, and the barrier layer has a thickness in a range of 5 nm to 10 nm,
wherein the chromium oxide layer is obtained through an oxidation process performed on the chromium layer, the oxidation process having process parameters of: a temperature in a range of 200° C., to 500° C., and an oxygen flow in a range of 20 sccm to 50 sccm; or, a temperature of 200° C. to 500° C. and a vapor flow in a range of 40 sccm to 100 sccm.

2. The photomask according to claim 1, further comprising a critical dimension that is a dimension of the opening.

3. The photomask according to claim 1, a material of the substrate comprises quartz glass.

4. The photomask according to claim 2, wherein the opening is formed by etching the light shielding layer through a patterned pre-opening, a width of the patterned pre-opening in a direction parallel with the surface of the substrate is equal to a sum of the critical dimension and twice the thickness of the barrier layer.

5. A method for manufacturing a photomask, comprising:
   providing a substrate and a light shielding layer located on the substrate;
   forming an opening in the light shielding layer to expose a surface of the substrate; and
   forming a barrier layer covering an entire side wall of the opening and also covering a top surface of the light shielding layer away from the substrate, wherein a bottom of the barrier layer contacts the substrate, an outer surface of the barrier layer is arc-shaped at an intersection of the side wall of the opening and the top surface of the light shielding layer away from the substrate, the light shielding layer is a chromium layer, the barrier layer is a chromium oxide layer, and the barrier layer has a thickness in a range of 5 nm to 10 nm,
   wherein an oxidation process is performed on the chromium layer to form the chromium oxide layer; the oxidation process having process parameters of: a temperature in a range of 200° C. to 500° C., and an oxygen flow in a range of 20 sccm to 50 sccm; or, a temperature of 200° C. to 500° C. and a vapor flow in a range of 40 sccm to 100 sccm.

6. The method for manufacturing according to claim 5, wherein the forming an opening in the light shielding layer to expose a surface of the substrate comprises: forming a photoresist layer on the light shielding layer; exposing and developing the photoresist layer to form a patterned pre-opening, the patterned pre-opening exposing the top surface of the light shielding layer; and etching the light shielding layer through the patterned pre-opening to form the opening exposing the surface of the substrate.

7. The method for manufacturing according to claim 6, wherein a dimension of the opening is a critical dimension of the photomask.

8. The method for manufacturing according to claim 5, wherein a material of the substrate comprises quartz glass.

9. The method for manufacturing according to claim 7, wherein a width of the patterned pre-opening in a direction parallel with the surface of the substrate is equal to a sum of the critical dimension and twice the thickness of the barrier layer.

* * * * *